United States Patent [19]
Nishimura et al.

[11] 3,848,194
[45] Nov. 12, 1974

[54] AUTOMATIC GAIN CONTROL CIRCUIT

[75] Inventors: Katsutoshi Nishimura; Kiyoji Fujisawa, both of Osaka, Japan

[73] Assignee: Matsushita Electric Industrial Co., Limited, Osaka, Japan

[22] Filed: July 16, 1973

[21] Appl. No.: 379,334

[52] U.S. Cl. ..................... 330/29, 330/86, 330/134, 330/136, 330/141
[51] Int. Cl. ............................................. H03g 3/30
[58] Field of Search ....... 330/29, 86, 134, 136, 141; 325/404, 410, 413

[56] References Cited

UNITED STATES PATENTS

| | | | |
|---|---|---|---|
| 2,544,340 | 3/1951 | Maxwell | 330/141 X |
| 2,580,020 | 12/1951 | Hammond | 330/141 |
| 3,617,777 | 11/1971 | Kuoelski | 330/141 X |
| 3,623,143 | 11/1971 | Marshall | 330/136 X |

FOREIGN PATENTS OR APPLICATIONS

| | | | |
|---|---|---|---|
| 212,942 | 4/1941 | Switzerland | 330/136 |

*Primary Examiner*—Herman Karl Saalbach
*Assistant Examiner*—James B. Mullins
*Attorney, Agent, or Firm*—Wenderoth, Lind & Ponack

[57] ABSTRACT

An automatic gain control circuit has two rectifiers and a variable impedance element to which the output of the rectifiers is applied so as to obtain the gain control operation. One of the two rectifiers has a fast attack time, and controls the variable impedance element when the input signal increases suddenly, and the other one controls the variable impedance element for the time other than the time when a sudden change of the input signal is occurring, so that there is no overshoot in the output signal even through the input signal increases suddenly.

3 Claims, 13 Drawing Figures

(PRIOR ART)

AUTOMATIC GAIN CONTROL CIRCUIT

BACKGROUND OF THE INVENTION

This invention relates generally to automatic gain control circuits, and more particularly to automatic gain control circuits for audio systems.

In general, an output of automatic gain control circuits has an overshoot arising because of a time lag in the control circuit. Where such circuits are employed in an apparatus such as a tape recorder having a small dynamic range, there is a disadvantage that a harmful harmonic distortion due to nonlinear characteristics of the apparatus are introduced into the output signals.

BRIEF SUMMARY OF THE INVENTION

A general object of this invention is to provide a distortion-free automatic gain control circuit.

Another object of this invention is to provide an automatic gain control circuit having excellent transient characteristics.

Another object of this invention is to provide an automatic gain control circuit which is suitable for applying to apparatus such as a magnetic tape recorder.

These objects are achieved by providing an automatic gain control circuit according to the present invention, which comprises an input terminal to which an input signal is applied, an output terminal, a variable gain control means connected between said input terminal and said output terminal, a variable impedance means which is coupled to said variable gain control means, said variable impedance means controlling the gain of the circuit by d.c. control signals applied at a control terminal thereof, an amplifier means which is coupled to said input terminal and provides a first and a second output signals, a first rectifier means which is connected to said amplifier means to receive said first output signal of said amplifier means and which provides said control signal through a first smoothing circuit, and a second rectifier means which is connected to said amplifier means to receive said second output signal of said amplifier means and which provides said control signal through a second smoothing circuit.

BRIEF DESCRIPTION OF THE DRAWINGS

These and other objects of the invention will be apparent from a consideration of the following detailed description with reference to the accompanied drawings, wherein.

DETAILED DESCRIPTION OF THE PREFERRED EMBODIMENT

Figure 1:
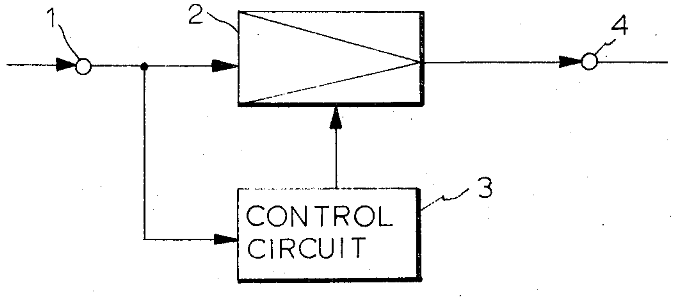
(PRIOR ART) FIG.1
FIG. 1 is a basic block diagram of an automatic gain control circuit.

As background, and referring to FIGS. 1 and 2, the operation of a conventional automatic gain control circuit will be explained. In FIG. 1, which shows a basic block diagram of an automatic gain control circuit, an input signal applied to an input terminal designated by a reference numeral 1 is fed out at an output terminal 4 through a variable gain amplifier. A control circuit 3, which comprises an amplifier, a rectifier and a variable impedance element, is coupled to the variable gain amplifier 2.

Figures 2A, 2B, 2C:
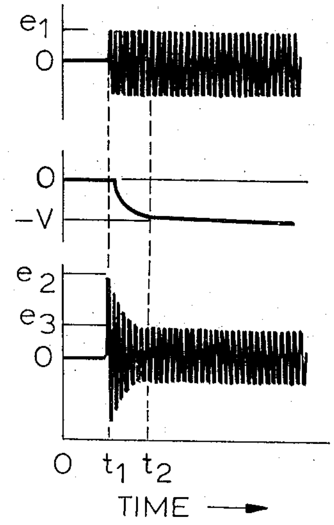
FIGS. 2*a* – 2*c* are signal waveforms occurring at different points during the operation of the circuit shown in FIG. 1.

The signal waveforms at the different points of the circuit of FIG. 1 are shown in FIGS. 2*a*–2*c*, in which FIG. 2*a* shows the waveform of the input signal applied to the input terminal, *b* shows the dc output voltage of the rectifier included in the control circuit 3, and FIG. 2*c* shows the waveform of the output signal which appears at the output terminal 4.

Now, at the time $t_1$, it is assumed that a signal having an amplitude $e_1$ is suddenly applied at the input terminal 1. Thus suddenly applied signal is fed to the variable gain amplifier 2 and to the control circuit 3. The control circuit 3 amplifies the incoming signal and rectifies the amplified signal into a dc voltage, the potential of which varies corresponding to the input signal amplitude level. This dc voltage functions to vary the impedance of the variable impedance element. This variable impedance element is coupled to the variable gain amplifier 2 so as to vary the gain of this amplifier. As a result, the output amplitude is automatically controlled at a predetermined magnitude. However, as shown in FIG. 2*b*, there is a definite length of time $t_2$–$t_1$ which is necessary until the dc voltage reaches a steady-state potential –V corresponding to the input level. Consequently, the output signal reaches a steady-state value $e_3$ at the time $t_2$. During the time from $t_1$ to $t_2$, the variable gain amplifier 2 remains at a higher gain, and so it results in an overshoot having an amplitude $e_2$ as shown in FIG. 2*c*.

According to the present invention, the problem of such an overshoot can be solved. In the following, an embodiment of an automatic gain control circuit of the invention will be described with reference to FIGS. 3 and 4.

Figure 3:
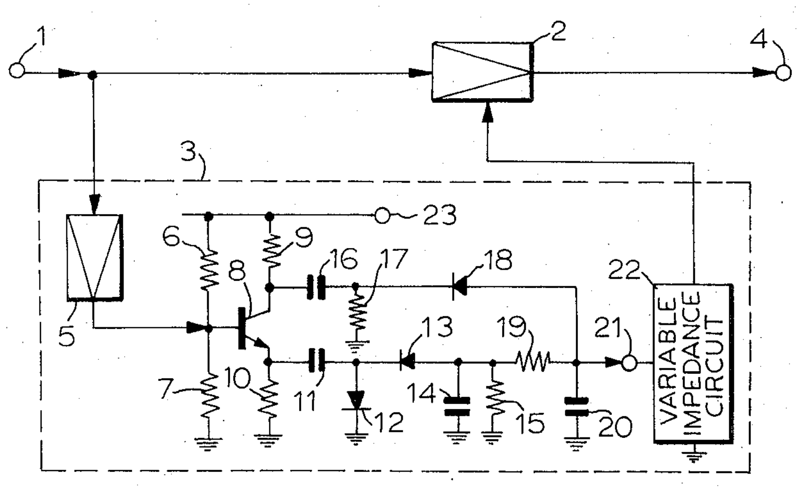
FIG. 3 is a schematic diagram of a preferred embodiment of the present invention.

Referring to FIG. 3, the parts designated by the reference numerals 1 to 4 are similar devices to those having the same reference numerals in FIG. 1, respectively. The control circuit 3 of FIG. 3 includes an amplifier 5 and a transistor 8. Resistors 6 and 7 are bias resistors for the base of the transistor 8. A resistor 9 is connected between the collector of the transistor 8 and a dc power supply line 23. A resistor 10 is connected between the emitter of the transistor 8 and the ground.

The emitter of the transistor 8 is connected to a voltage doubling rectifier circuit which comprises a capacitor 11, two diodes 12 and 13, a capacitor 14 and parallel connected resistor 19, all connected in the configuration a shown. The collector of the transistor 8 is connected to a capacitor 16. The other end of the capacitor 16 is grounded through a resistor 17, and it is also grounded through a series connection of a diode 18 and a capacitor 20. The output side of the voltage doubling rectifier is connected to the junction point of the diode 18 and the capacitor 20 through a resistor 19. That junction point is also connected to a control terminal 21 of a variable impedance circuit 22, the output of which is connected to the amplifier 2.

Figures 4D, 4E, 4F, 4G, 4H, 4I:
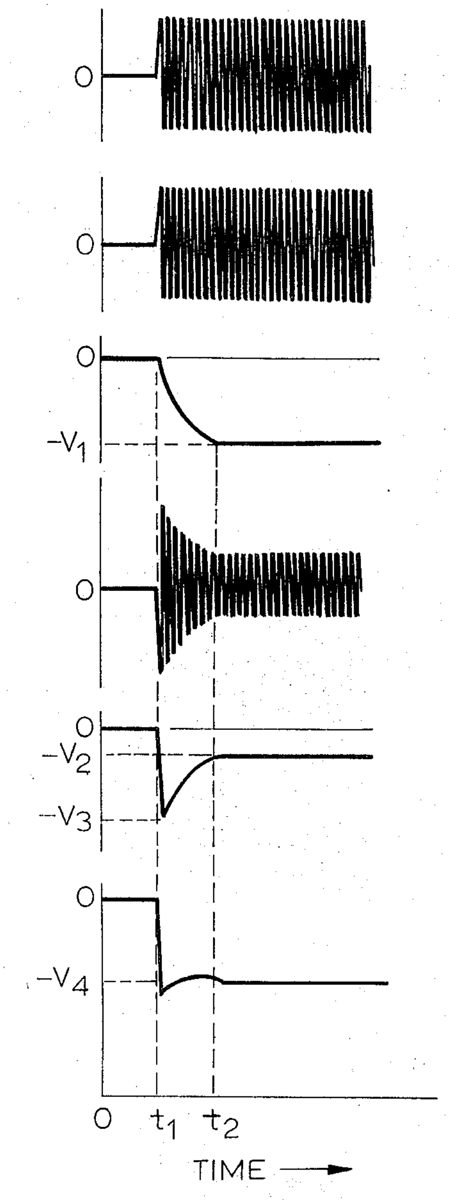
FIGS. 4*d* – 4*i* are signal waveforms occurring at different points during the operation of the circuit shown in FIG. 3.

When an input signal is applied to the input terminal 1, the applied signal is supplied to the variable gain amplifier 2 and the control circuit 3. In the control circuit 3, the signal is amplified by the amplifier 5 and is fed to the base of the transistor 8. When the signal applied at the base has a waveform as shown in FIG. 4*d*, an output signal as shown in FIG. 4*e* appears at the emitter, the waveform of which is similar to the input waveform. The emitter signal is rectified by the voltage doubling rectifier comprising the capacitor 11, the diodes 12 and 13, the capacitor 14 and the resistor 15. As a result, a rectified voltage shown in FIG. 4*f* is generated across the parallel connection of the capacitor 14 and the resistor 15. The transient characteristics of that rectified voltage are determined according to the emitter output impedance, the forward resistance of the diodes 12 and 13, the capacitance of the capacitors 11 and 14 etc.

On the other hand, a signal having an overshoot shown in FIG. 4*g* appears at the collector of the transistor 8. The waveform of this signal depends on the function of the rectifier circuit connected to the emitter of the transistor 8. That is, the circuit arrangement is such that lower impedance diodes biased in the forward direction are connected to the emitter circuit until the charge voltage of the capacitor 14 reaches a steady state value. Therefore, the transistor amplifier 8 operates at a higher gain during this time. When the charge current into the capacitor 14 becomes to a very small value, the impedance of the diodes increases to a higher value and the gain of the transistor amplifier decreases. This is because the amount of the current feedback increases according to the increase in the impedance of the rectifier circuit connected to the emitter of the transistor 8.

The collector output signal shown in FIG. 4*g* is rectified by a half wave rectifier comprising the diode 18 and the smoothing capacitor 20. Then, there is generated a dc voltage shown in FIG. 4*h* across the capacitor 20, i.e., at the terminal 21. In this case, a capacitor having a low capacitance is used for the smoothing capacitor 20 so as to make the attack time of the resulting dc voltage as short as possible.

Since the rectified dc voltage from the voltage doubling rectifier is also applied to the terminal 21 through the resistor 19, a dc control signal as shown in FIG. 4*i* is provided to the variable impedance circuit 22. In order to avoid a distortion due to a large ripple contained in the output of the rectifier having the small capacitance smoothing capacitor, the resistance values of the emitter resistor 10 and the collector resistor 9 are selected so that the most of dc control signal, in the steady state condition, is the dc voltage from the voltage doubling rectifier. The time required to bring the dc control signal to a steady-state potential $-V_4$ after the application of the input signal is negligible because of the short attack time as mentioned above. Accordingly, the overshoot does not appear in the output signal.

Figure 5:
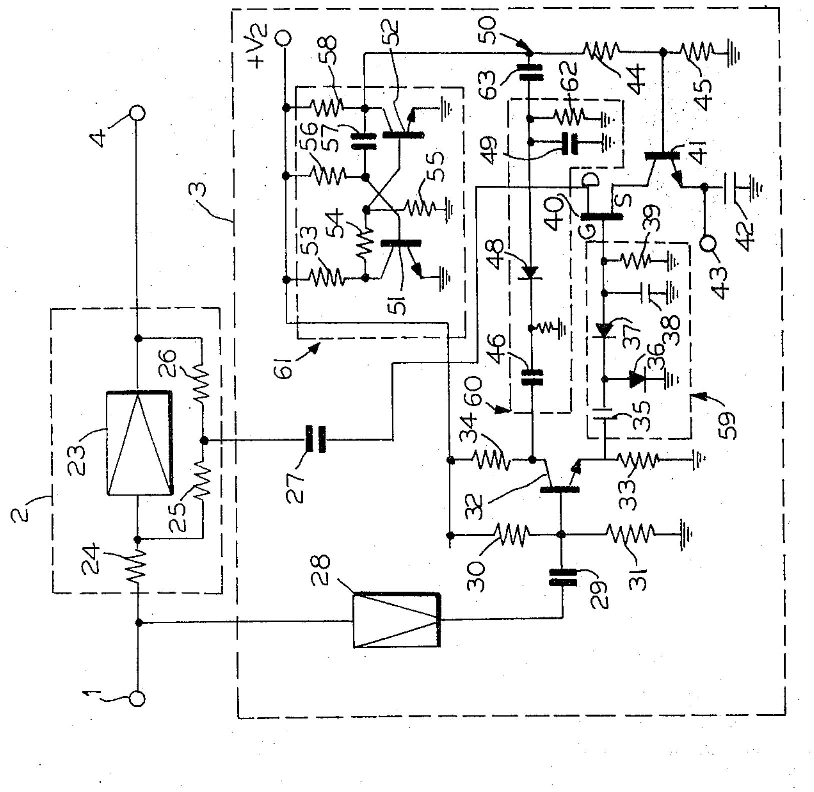
FIG. 5 is a schematic diagram of another preferred embodiment of the present invention.

FIG. 5 shows another embodiment of the present invention, and FIGS. 6d - 6h show the waveforms occurring at the different points in the circuit shown in FIG. 5. In FIG. 5, the parts designated by the reference numerals 1 to 4 are similar devices to those designated by the same reference numerals in FIG. 1.

In FIG. 5, the variable gain amplifier 2 is an operational amplifier comprising an amplifier 23, an input resistor 24 and feedback resistors 25 and 26. The junction point of the resistors 25 and 26 is connected to ground through a capacitor 27 and a variable impedance element 40 connected in series with each other. The variable impedance element 40 functions so that the gain of the operational amplifier varies in accordance with change of the impedance of the variable impedance element.

The control circuit 3 includes an amplifier 28 and a transistor 32, the base of which is connected to the amplifier 28 through a coupling capacitor 29. The transistor operates as an amplifier. Resistors 30 and 31 are biasing resistors for the base of the transistor 32. The emitter of the transistor 32 is grounded through a resistor 33, and also it is connected to a first rectifier circuit 59 which comprises a capacitor 35, two diodes 36 and 37, a capacitor 38 and a resistor 39. On the other hand, the collector of the transistor 32 is connected to a power supply line having a voltage $(+V_2)$ through a resistor 34, and it is also connected to a second rectifier circuit 60 which comprises a capacitor 46, resistors 47 and 62, a diode 48 and a capacitor 49.

The variable impedance element 40 is a field effect transistor, the gate G of which is connected to the output terminal of the first rectifier circuit 59 and the drain D thereof is connected to the capacitor 27. The source of the field effect transistor 40 is connected to a transistor 41 which acts as a switching device and, in the steady-state condition, the source is equivalently grounded.

The emitter of the switching transistor 41 is equivalently grounded by means of a capacitor 42, and it is also connected to a terminal 43 to which a voltage for controlling the operating point of the field effect transistor 40 is provided. The base of the switching transistor 41 is grounded through a resistor 45, and it is also connected to the terminal 50 of a switching time control circuit 61 through a resistor 44. On the other hand, the output of the second rectifier circuit 60 is also connected to the terminal 50 through a capacitor 63 so as to trigger the switching time control circuit 61.

The embodiment shown in FIG. 5 employs a well known mono-stable multivibrator as the switching time control circuit 61. The multivibrator comprises transistors 51 and 52, resistors 53, 54, 55 and 56, and a capacitor 57. The transistor 52 is in the OFF condition at the steady-state condition, and it is turned ON when the trigger signal is applied to the terminal 50 from the second rectifier circuit 60. After the time determined by the time constant of the resistor 56 and the capacitor 57, the transistor 52 returns again to the OFF condition.

The operation of the embodiment of FIG. 5 is as follows:

In the steady-state condition, the transistor 52 is in the OFF condition and the collector potential thereof is approximately equal to the voltage $(+V_2)$ of the power supply line. The voltage $(+V_2)$ is divided by the resistors 44 and 45 and is applied to the base of the switching transistor 41. Therefore, the transistor 41 is in the ON condition. In this condition, the field effect transistor 40 is also conductive, since the gate potential thereof is approximately equal to zero because of the fact that there is no rectified voltage produced by the rectifier circuit 59. The resistance between the drain D and the source S is at the lowest value, and that lowest resistance is connected between the junction point of the feedback resistors 25 and 26 and the ground. Consequently, the gain of the variable gain amplifier 2 becomes a maximum. The gain of this variable gain amplifier 2 decreases in accordance with an increase on the voltage of gate of the field effect transistor 40 in a negative direction. This is because an increase in the voltage on the gate in a negative direction results in an increase in the resistance between the drain and the source.

Figure 6:
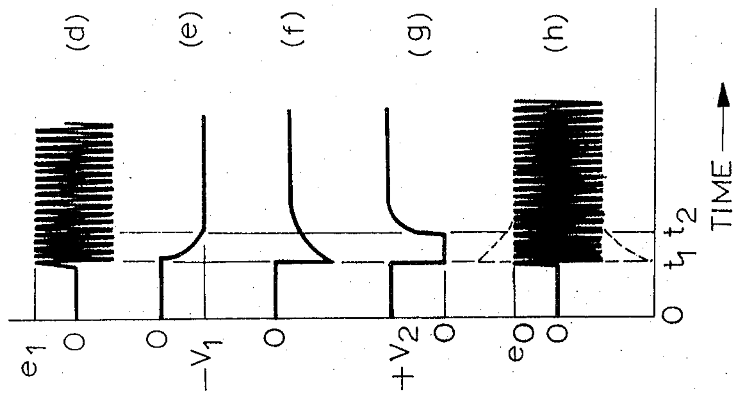
FIGS. 6*d* – 6*h* are signal waveforms occurring at different points during the operation of the circuit shown in FIG. 5.

Now, at the time $t_1$ it is assumed that a signal having an amplitude $e_1$ is suddenly applied at the input terminal, as shown in FIG. 6*d*. This suddenly applied signal is fed to the variable gain amplifier 2 and to the amplifier 28. The signal amplified by the amplifier 28 is fed to the base of transistor 32. The signal having a waveform similar to the base signal appears at the emitter, and it is rectified by the first rectifier circuit 59. The first rectifier 59 is a voltage doubling rectifier circuit including the capacitor 35, the diodes 36 and 37, the capacitor 38 and the resistor 39. The rectified voltage is applied to the gate G of the field effect transistor 40, and it varies the resistance thereof. As a result, the gain of the variable gain amplifier 2 is controlled to a predetermined value.

In the conventional circuit, as the rectified signal reaches a steady-state value ($-V_1$) after the time ($t_2$–$t_1$) because the first rectifier has a time lag due to the smoothing circuit thereof, as shown in FIG. 6*e*, an overshoot appears in the output signal. The embodiment shown in FIG. 5 eliminates such an overshoot by reducing the gain of the variable gain amplifier during the time ($t_2$–$t_1$). This is accomplished by opening the connection between the source of the field effect transistor 40 and the ground by means of the switching transistor 41. At this opening of that connection, the resistance between the junction point of the feedback resistors 25 and 26 and the ground becomes infinite, and the gain of the variable amplifier becomes a minimum as determined by the input resistor 24 and the feedback resistors 25 and 26.

The control operation of the switching transistor 41 is as follows: The signal derived from the collector of the transistor 32 is rectified by the diode 48. The resulting rectified signal has a waveform as shown in FIG. 6*f*, and it is applied to the multivibrator 61 so as to fire it. The output of the multivibrator 61 has a waveform as shown in FIG. 6*g*. The duration of this quasistate is adjusted so that its length is ($t_2$–$t_1$). The switching control signal, which has a waveform as shown in FIG. 6(g), is applied to the base of the transistor 41, so that the switching transistor 41 is switched to the OFF condition during the time ($t_2$–$t_1$) because of the fact that the base voltage is being held to zero.

In the above explanation, although voltage doubling rectifier circuits are used for the emitter side of the transistors 8 and 32, and half wave rectifiers are used for the collector side of the transistors 8 and 32, these rectifiers are not limited to the circuit arrangement described in the above embodiments is not limited to these rectifiers although the actual circuits used in some stages are not shown, it is evident that they are various well-known types of circuits.

There is described hereinbefore preferred embodiments of the invention, and it is apparent that various modifications may be made without departing from the spirit and scope of the invention which is defined by the following claims.

What is claimed is:

1. An automatic gain control circuit comprising an input terminal to which an input signal is applied, an output terminal, a variable gain control means connected between said input terminal and said output terminal and having a control terminal, and a variable impedance means which is coupled to said variable gain control means and controls the gain thereof according to a d.c. control signal applied to said control terminal thereof, said variable impedance means being comprised of an amplifier means coupled to said input terminal and which provides first and second output signals, a first smoothing circuit, a first rectifier means connected between said amplifier means and said first smoothing circuit for receiving said first output signal from said amplifier means and producing a control signal through said first smoothing circuit, a second smoothing circuit, and a second rectifier means connected between said amplifier means and said second smoothing circuit for receiving said second output signal from said amplifier means and producing a control signal through said second smoothing circuit wherein said variable gain control means is an operational amplifier having an input resistor and two feedback resistors connected in series, a feedback capacitor, the junction point of said feedback resistors being coupled to said variable impedance means through said feedback capacitor, said variable impedance means including a field effect transistor, the drain of which is coupled to said junction point and the gate of which is coupled to the output of said first rectifier means, a switching transistor having a collector connected to the source of said field effect transistor, said switching transistor acting as a switch inserted between the source of said field effect transistor and ground, said switching transistor having the base coupled to said second rectifier for being controlled thereby, said amplifier means including a transistor, the emitter of which is connected to said first rectifier means and the collector of which is connected to said second rectifier means, and said second rectifier means further including a switching time control circuit triggered by said second rectifier means and which controls said switching transistor.

2. An automatic gain control circuit comprising an input terminal to which an input signal is applied, an output terminal, a variable gain control circuit connected between said input terminal and said output terminal and having a first control terminal, and a control circuit means connected between said input terminal and said first control terminal, wherein said control circuit means is comprised of an amplifier means coupled to said input terminal and which provides first and second output signals, first and second rectifier means, first and second smoothing circuits, and a variable impedance means which is coupled to said first control terminal and controls the gain of said variable gain control circuit according to a d.c. control signal applied to a second control terminal of said variable impedance means, said amplifier means including a transistor, said first rectifier means being connected between the emitter of said transistor and said first smoothing circuit for receiving said first output signal from said amplifier means and producing a control signal through said first smoothing circuit, said second rectifier means being connected between the collector of said transistor and said second smoothing circuit for receiving said second output signal from said amplifier means and producing a control signal through said second smoothing circuit, and said first and second smoothing circuits being connected to the second control terminal of said variable impedance means.

3. An automatic gain control circuit comprising an input terminal to which an input signal is applied, an output terminal, a variable gain control circuit connected between said input terminal and said output terminal and having a first control terminal, and a control circuit means connected between said input terminal and said control terminal, said control circuit means comprising an amplifier means, first and second rectifier means, and a variable impedance means having a second control terminal and which is coupled to said first control terminal and controls the gain of said variable gain control circuit according to a d.c. control signal applied to said second control terminal of said variable impedance means, wherein said variable gain control means is an operational amplifier having an input resistor and two feedback resistors connected in series, a feedback capacitor, the junction point of said feedback resistors being coupled to said variable impedance means through said feedback capacitor, said variable impedance means including a field effect transistor, the drain of which is coupled to said junction point and the gate of which is coupled to the output of said first rectifier means, a switching transistor having a collector connected to the source of said field effect transistor, said switching transistor acting as a switch inserted between the source of said field effect transistor and ground, said switching transistor having its base coupled to said second rectifier and being controlled thereby, said amplifier means including a transistor, the emitter of which is connected to said first rectifier means and the collector of which is connected to said second rectifier means, and said second rectifier means further includes a switching time control circuit which is triggered by said second rectifier means and which controls said switching transistor.

* * * * *